(12) United States Patent
Ma

(10) Patent No.: US 7,604,495 B2
(45) Date of Patent: Oct. 20, 2009

(54) ZERO INSERTION FORCE CONNECTOR WITH IMPROVED DRIVING DEVICE

(75) Inventor: Hao-Yun Ma, Tu-cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/151,540

(22) Filed: May 7, 2008

(65) Prior Publication Data

US 2008/0280476 A1    Nov. 13, 2008

(30) Foreign Application Priority Data

May 7, 2007  (TW) .............................. 96207252 U

(51) Int. Cl.
*H01R 13/625* (2006.01)
(52) U.S. Cl. ...................... 439/342; 439/259
(58) Field of Classification Search ................. 439/345, 439/342, 259
See application file for complete search history.

(56) References Cited

U.S. PATENT DOCUMENTS 6,065,990 A * 5/2000 McHugh et al. ............. 439/342
6,083,028 A * 7/2000 Pei et al. ..................... 439/342
6,431,900 B1 * 8/2002 Yu .............................. 439/342
6,669,500 B1 * 12/2003 Ju .............................. 439/342
6,921,276 B2 * 7/2005 McClinton .................. 439/342

* cited by examiner

*Primary Examiner*—Briggitte R Hammond
(74) *Attorney, Agent, or Firm*—Andrew C. Cheng; Wei Te Chung; Ming Chieh Chang

(57) ABSTRACT

A socket connector for connecting an IC package to a printed circuit board (PCB) comprises an insulating base (11) arranged a plurality of conductive terminals therein, a cover (13) assembled on the base (11) and a driver device actuating the cover to slide relative to the insulating base. The driver device comprises a first retaining member (15) fixed in the cover (13), a whirling member (16) engaged with the base (11) and a driver member (14) connecting with the first retaining member (15) and the whirling member (16). The first retaining member (15) and the whirling member (16) are pivotally attached with each other by a holding portion (154) formed on one of them, and the holding portion has an arc surface.

4 Claims, 5 Drawing Sheets

ZERO INSERTION FORCE CONNECTOR WITH IMPROVED DRIVING DEVICE

BACKGROUND OF THE INVENTION

1. Field of the invention

The present invention relates to a zero insertion force (ZIF) connector, and particularly to a socket connector having a driving device for urging a cover to slide on a base thereof.

2. Description of Related Art

U.S. patent application Ser. No. 11/983,020, filed on Nov. 5, 2007, which is assigned to a same assignee of this invention discloses a socket connector for connecting an IC package such as a CPU to a printed circuit board (PCB). The socket connector comprises an insulating base arranged a plurality of terminals therein, a cover assembled on the base and a driving device actuating the cover to slide on the insulating base. The driving device comprises a driver member, a retaining member and a whirling member. The retaining member is fixed in the cover and comprises a bending plate bent downwardly to urge with the whirling member. When the retaining member is driven by the whirling member, a driving force will concentrate on a root of the bending plate, which may damage the bending plate and lose the moving distance of the whirling member. Hence, a new design will be provided on basis of said patent application.

SUMMARY OF THE INVENTION

Accordingly, an object of the present invention is to provide a socket connector with an improved driver device.

In order to achieve the object set forth, a socket connector for connecting an IC package to a PCB comprises: an insulating base arranged a plurality of conductive terminals therein; a cover assembled on the base; and a driver device actuating the cover to slide relative to the insulating base, comprising a first retaining member fixed in the cover, a whirling member engaged with the base and a driver member connecting with the first retaining member and the whirling member. The first retaining member and the whirling member are pivotally attached with each other by a holding portion formed on one of them, and the holding portion has an arc surface.

Other objects, advantages and novel features of the present invention will become more apparent from the following detailed description of the present embodiment when taken in conjunction with the accompanying drawings.

DETAILED DESCRIPTION OF THE INVENTION

Figure 1:
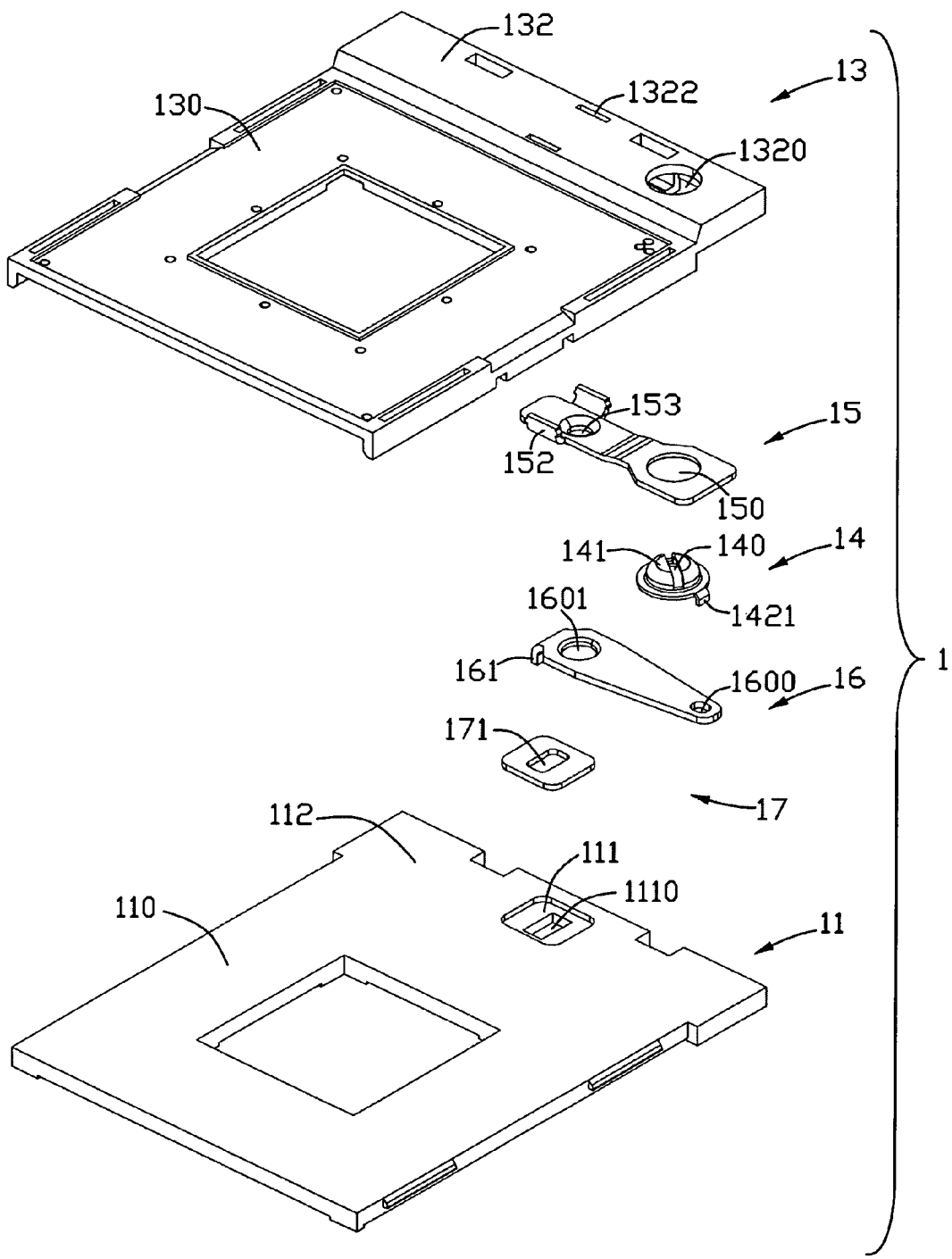
FIG. 1 is an exploded perspective view of a socket connector in accordance with the present invention.

Reference will now be made to the drawing figures to describe a preferred embodiment of the present invention in detail.

Figure 2:
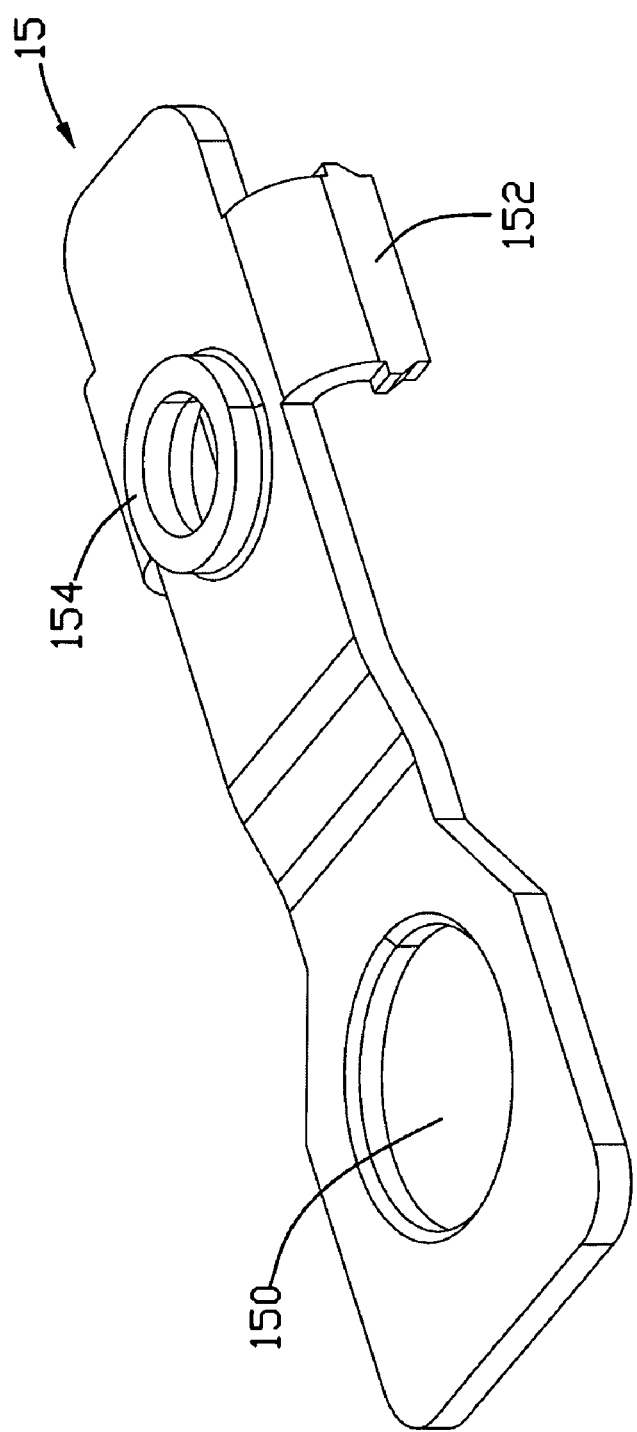
FIG. 2 is a perspective view of a first retaining member of the socket connector shown in FIG. 1.

Referring to FIGS. 1 and 2, a ZIF socket connector 1 in accordance with the present invention is adapted for electrically connecting an IC package such as a CPU to a PCB (not shown). The ZIF socket connector 1 comprises an insulating base 11 mounting a plurality of terminals (not shown) thereon, an insulating cover 13 movable assembled on the base 11 and a driver device locating between the base 11 and the cover 13.

As shown in FIG. 1, the insulating base 11 has a rectangular shape and comprises a base portion 110 with a plurality of conductive terminals (not shown) received therein and a supporting portion 112 extending forward from one end of the base portion 110. A shallow receiving recess 111 of a four-square shape is defined in the supporting portion 112 with a rectangular slot 1110 therein.

Figure 3:
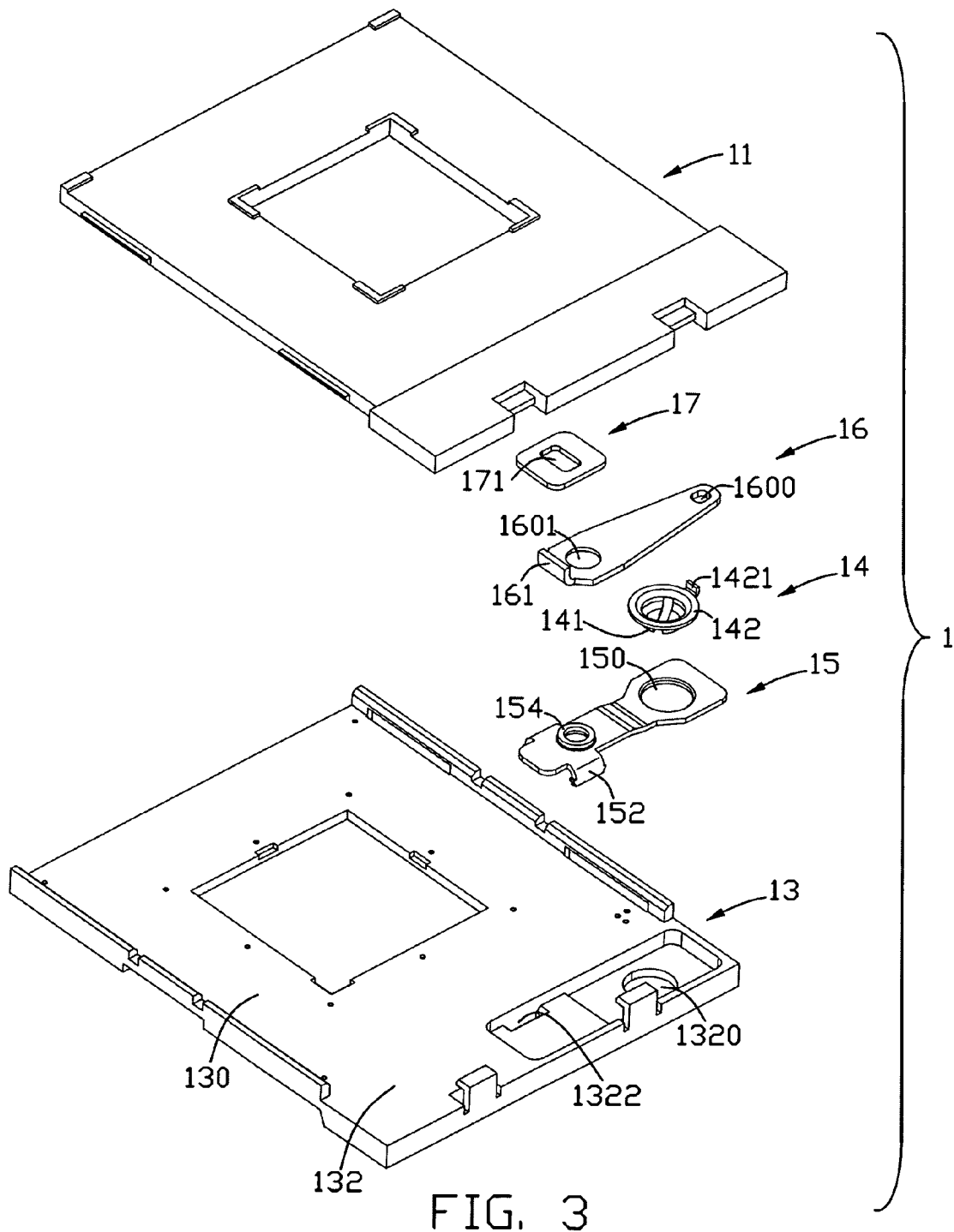
FIG. 3 is another exploded perspective view of the socket connector shown in FIG. 2.

Referring to FIGS. 1 and 3, the cover 13 comprises a main body 130 and a head portion 132 extending from one end of the main body 130. The main body 130 and the head portion 132 are respectively corresponding and cooperating with the base portion 110 and supporting portion 112 of the insulating base 11. And a space is defined between the head portion 132 and the supporting portion 112 to receive the driver device. A circle opening 1320 is defined adjacent one end of the head portion 132. A pair of transverse grooves 1322 is respectively defined in the middle portion of the head portion 132.

The driver device comprises a driver member 14, a first retaining member 15, a second retaining member 17 and a whirling member 16. See FIG. 1, the driver member 14 is similar to a cap like and comprises a hollow calotte operating portion 141 and a circinal brim portion 142. The brim portion 142 and the operating portion 141 are homocentric and the brim portion 142 is bigger than the operation portion in diameter, see FIG. 3. A locking portion 1421 extends outward and then downward from an edge of the brim portion 142, which forms an adverse L shape. On a top wall of the operating portion 141, an elongated slot 140 is defined for a tool to operate the driver member.

Referring to FIGS. 1 and 2, the first retaining member 15 is in an elongated shape with a plurality of bending portions and openings. A pair of first bending portions 152 is bent upwardly from opposite lateral sides of the first retaining member 15. A circinal holding portion 154 with a through hole 153 therein extends downwardly from a bottom wall of the retaining member 15 between the bending portions 152. The holding portion 154 is formed by dragging in the metal plate thereof and being burnished to form a smooth arc surface. A circle receiving hole 150 is defined in one end of the retaining member 15 to receive the driver member 14. The second retaining member 17 is in a foursquare like plate and defines a rectangular slot 171 in the middle thereof. The whirling member 16 is in a wedge shape and respectively defines a circle opening 1601 and a rectangular slot 1600 in opposite ends thereof. At a wider end of the whirling member 132, a second bending portion 161 is formed by bending downwardly.

Figure 4:
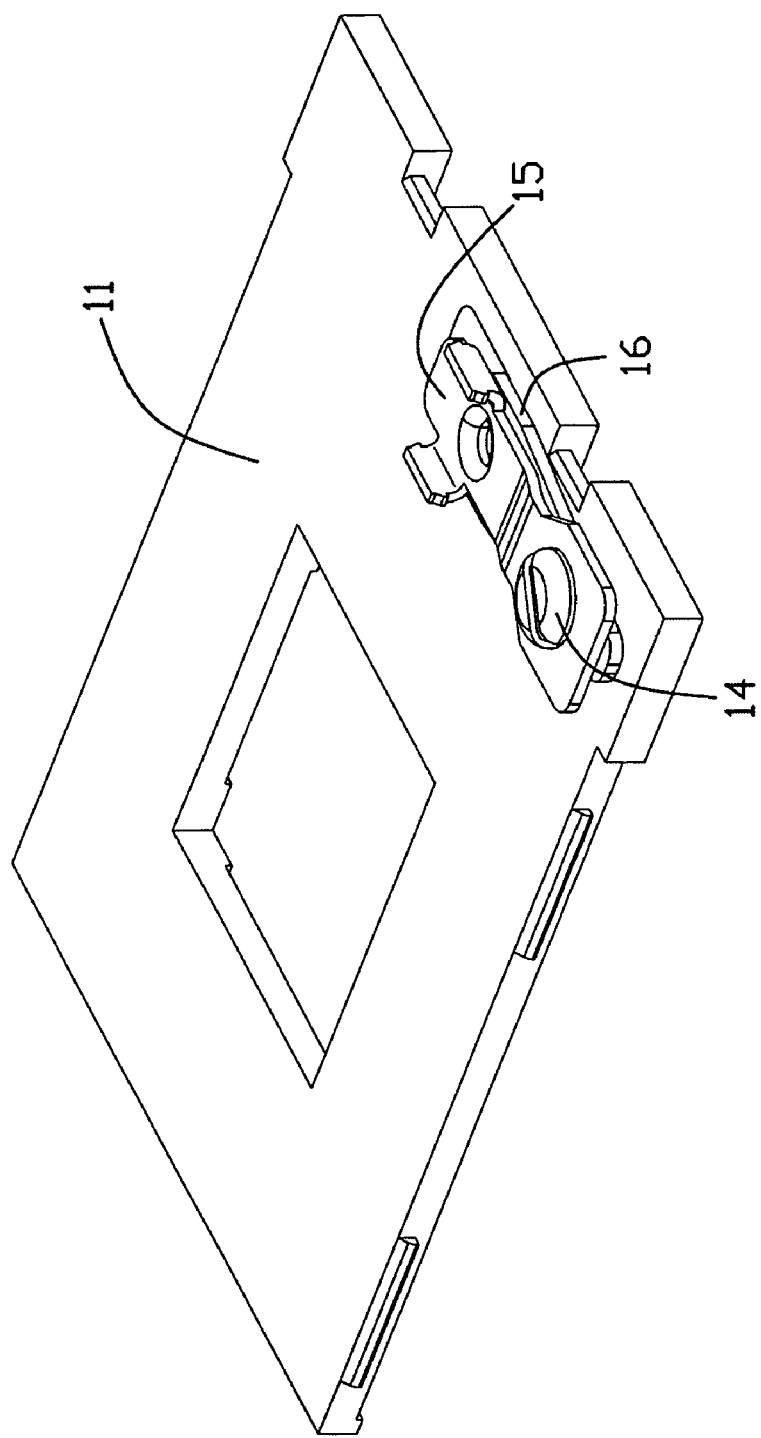
FIG. 4 is a perspective view of a driver device mounting on a base of the socket connector.

Referring to FIG. 1, the second retaining member 17 is located in the receiving recess 111 and the rectangular slot 171 is corresponding with the slot 1110 on the base portion 11. The second bending portion 161 of the whirling member 16 is received in the slot 171 and slot 1110. The whirling member 16 is attached on the bottom of the driver member 14 by the rectangular slot 1600 being locked by the locking portion 1421. The driver member 14 goes through the receiving hole 150 of the first retaining member 15 with its brim portion 142 being blocked by edges of the receiving hole 150, and the operating portion 141 is located in the circle opening 1320 on the head portion 132 of the cover 13. The first retaining member 15 is positioned on the surface of the whirling member 16 with the circinal holding portion 154 engaged with the circle opening 1601 of the whirling member 16, which can be best shown in FIG. 4. Then the cover 13 is assembled on the base 11, and the first bending portions 152 of the first retaining member are inserted into the transverse grooves 1322 of the cover 13. The driver device is received in the space.

Figure 5:
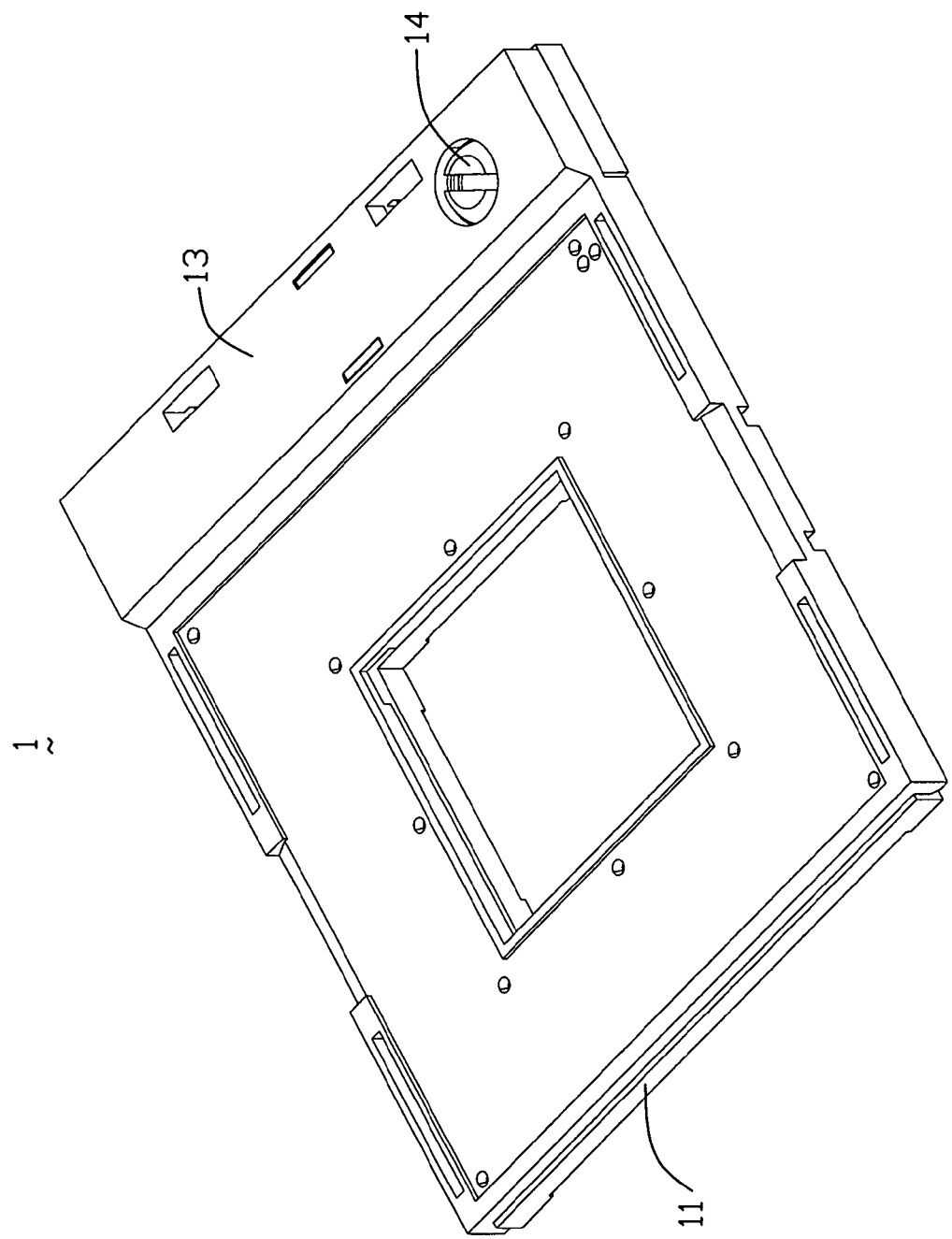
FIG. 5 is a perspective view of the socket connector shown in FIG. 1.

FIG. 5 is a perspective view of the ZIF socket connector after it is completely assembled, and combining with FIG. 1 and FIG. 3, user can use a screwdriver (not shown) to operate the driver member 14, and the whirling member 16 is driven to urge the second retaining member 17 to move forward or backward, which will actuate the cover 13 shift. As the holding portion 154 is in a circinal shape and the driving force produced by the driver member 14 will be spread around the circumference of the holding portion 154, which can avoid the driving force concentrating on a point and resulting in distortion of the holding portion 154. The work theory of the ZIF socket connector is common knowledge for people in the field, and further description will be omitted here.

The present invention is not limited to the electrical connector mentioned above. This disclosure is illustrative only, change may be made in detail, especially in matter of shapes, size, and arrangement of parts within the principles of the invention. For example, the holding portion 154 on the first retaining member 15 and the circle opening 1601 on the whirling member 16 can exchange their positions.

What is claimed is:

1. A socket connector for connecting an IC package to a printed circuit board (PCB) comprising:

an insulating base arranged a plurality of conductive terminals therein;

a cover assembled on the base; and a driver device actuating the cover to slide relative to the insulating base, comprising a retaining member fixed in the cover, a whirling member engaged with the base, and a driver member located between same ends of the retaining member and the whirling member to actuate the retaining member and the whirling member to move relatively about a same pivot defined in the other ends; wherein the retaining member and the whirling member share the same pivot with each other with a circumferential holding surface being drawn from one of said retaining member and said whirling member to engage a complaint hole formed in the other.

2. The socket connector as claimed in claim 1, wherein the driver member includes an operating portion received in a round hole of the retaining member, a brim portion sandwiched between the retaining member and the whirling member, and a locking portion located on a periphery of the circular portion and received in a slot of the whirling member.

3. The socket connector as claimed in claim 2, wherein both said round hole and said locking portion are spaced from said pivot.

4. The socket connector as claimed in claim 3, wherein a pad is provided between the whirling member and the base to strength the interfering force between the whirling member and the base.

* * * * *